US008212286B2

(12) United States Patent
Fujii (10) Patent No.: US 8,212,286 B2
(45) Date of Patent: Jul. 3, 2012

(54) SEMICONDUCTOR LIGHT RECEIVING ELEMENT

(75) Inventor: Emiko Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 200 days.

(21) Appl. No.: 12/810,089

(22) PCT Filed: Dec. 25, 2008

(86) PCT No.: PCT/JP2008/003949
§ 371 (c)(1),
(2), (4) Date: Jun. 22, 2010

(87) PCT Pub. No.: WO2009/081585
PCT Pub. Date: Jul. 2, 2009

(65) Prior Publication Data
US 2010/0276775 A1   Nov. 4, 2010

(30) Foreign Application Priority Data
Dec. 26, 2007   (JP) .................................. 2007-334669

(51) Int. Cl.
*H01L 31/07* (2012.01)
*H01L 27/148* (2006.01)
*H01L 23/58* (2006.01)

(52) U.S. Cl. ........ 257/186; 257/233; 257/290; 257/640; 257/649; 257/E33.076; 257/E27.133; 257/E21.293; 438/72; 438/91; 438/380; 438/794

(58) Field of Classification Search .................... 438/71, 438/72, 91, 328, 380, 778, 791, 792, 793, 438/794, FOR. 94, FOR. 401; 257/184, 186, 257/233, 290, 639, 640, 649, E33.076, E31.063, 257/E27.133, E21.292, E21.293; 313/366, 313/498, 499, 501, 506, 507, 509; 315/368.19, 315/407
See application file for complete search history.

(56) References Cited

U.S. PATENT DOCUMENTS

| | | | | |
|---|---|---|---|---|
| 5,712,504 A | * | 1/1998 | Yano et al. | 257/452 |
| 6,404,004 B1 | * | 6/2002 | Arimochi et al. | 257/306 |
| 6,566,183 B1 | * | 5/2003 | Chen et al. | 438/230 |

FOREIGN PATENT DOCUMENTS

| | | |
|---|---|---|
| JP | 7-38141 A | 2/1995 |
| JP | 7-202252 A | 8/1995 |

(Continued)

OTHER PUBLICATIONS

International Search Report for PCT/JP2008/003949 mailed Apr. 7, 2009.

(Continued)

*Primary Examiner* — Julio J Maldonado
*Assistant Examiner* — Quovaunda V Jefferson (57) ABSTRACT

The semiconductor light receiving element 1 includes a semiconductor substrate 101, and a semiconductor layer having a photo-absorption layer 105 disposed on the top of the semiconductor substrate 101. The semiconductor layer of the semiconductor light receiving element 1 containing at least the photo-absorption layer 105 has a mesa structure, and a side wall of the mesa is provided with a protective film 113 covering the side wall. The protective film 113 is a silicon nitride film containing hydrogen, and a hydrogen concentration in one surface of the protective film 113 located at the side of the mesa side wall is lower than a hydrogen concentration in the other surface of the protective film 113 located at the side that is opposite to the side of the mesa side wall.

8 Claims, 10 Drawing Sheets

FOREIGN PATENT DOCUMENTS

| | | |
|---|---|---|
| JP | 8-162663 A | 6/1996 |
| JP | 2000022197 A | 1/2000 |
| JP | 2004200328 A | 7/2004 |
| WO | 2006080153 A | 8/2006 |

OTHER PUBLICATIONS

H. Ishihara et al., "High-Temperature Aging Tests on Planer Structure InGaAs/inP PIN Photodiodes With Ti/Pt and Ti/Au Contact", Electronics Letters, vol. 20, No. 16, Aug. 2, 1984, pp. 654-656.

M. R. Ravi et al., "Effect of Sulfur Passivation and Polyimide Capping on InGaAs-InP PIN Photodetectors", IEEE Transactions on Electron Devices, vol. 50, No. 2, Feb. 2003, pp. 532-534.

I. Watanabe et al., "A New Planer-Structure InAlGaAs-InAlAs Superlattice Avalanche Photodiode with a Ti-Implanted Guard-Ring", IEEE Photonics Technology Letters, vol. 8, No. 6, Jun. 1996, pp. 827-829.

* cited by examiner

FIG. 5

(a) 409, 412, 401, 410, 414 INCIDENT LIGHT (b) 409 { 408, 407, 406, 405, 404, 403, 402, 401 }  411  113, 214, 311

SEMICONDUCTOR LIGHT RECEIVING ELEMENT

The present application is the National Phase of PCT/JP2008/003949, filed Dec. 25, 2008, which is based on, and claims priority of, Japanese Patent Application No. 2007-334,669 filed 26 Dec. 2007, the disclosure of which is hereby incorporated by reference herein in its entirety.

TECHNICAL FIELD

The present invention relates to a semiconductor light receiving element.

BACKGROUND ART

In fields of optical communication, optical measurement, optical information processing or the like, faster and larger capacity communication is essential, and in particular, developments of semiconductor light receiving elements with enhanced faster response are indispensable in the field of the light receiving elements. Increased reliability, reduced cost and further increased productivity are required in these semiconductor light receiving elements, as well as enhanced device characteristics. Typical examples of semiconductor light receiving elements for the use in the wave length of 1 to 1.6 µm band include PIN photodiodes (hereinafter referred to as "PIN-PD") composed of compound semiconductors (see, for example, Non-Patent Documents 1 and 2), avalanche photodiodes (hereinafter referred to as "APD") (see, for example, Non-Patent Document 3 and Patent Document 1), and the like. A planar structure or a pseudo planar structure as described in Non-Patent Documents 1 and 3 or a mesa structure as described in Non-Patent Document 2 and Patent Document 1 are adopted in these semiconductor light receiving elements. The semiconductor light receiving element having a planar structure or a pseudo planar structure is configured without exposing the semiconductor layer such as, for example, a multiplication layer of the APD or the like, which is applied with larger electric field, or a photo-absorption layer or the like, in which tunneling current is easily generated in the narrow gap. Thus, such structure is more advantageous as compared with the mesa structure semiconductor light receiving element, in view of providing higher reliability. However, a formation of a guard ring by an ion implantation process is indispensable for the planar structure semiconductor light receiving element, in order to inhibit a multiplication in the edge in a peripheral region of a light receiving unit. Therefore, flexibility for the structural design is generally limited in the semiconductor light receiving element having the planar structure, and the manufacturing process tends to be complicated. This results in causing a problem of difficulties in providing simple manufacture, lower cost, improvement in the device characteristics or the like, which are critical in the practical use.

On the contrary, the semiconductor light receiving element having the mesa structure involves the formation of the light receiving region by an etching process, and therefore manufacturing process for such device is simple, and thus is advantageous in achieving the cost reduction. Further, since a p-n junction is formed with an epitaxial growth process, the device characteristic can be easily controlled, and higher flexibility is achieved in the structural design, as compared with the semiconductor light receiving element having the planar structure. In addition, since an ion implantation process or a diffusion process is not required, higher reproducibility in the device characteristics and in the manufacturing process is achieved. However, in the semiconductor light receiving element having the mesa structure, side surfaces of semiconductor layers 703 to 707 such as a multiplication layer 703 or a photo-absorption layer 705 or the like are exposed in a side surface of the light receiving region having the mesa structure (hereinafter referred to as "mesa side surface") similarly as in, for example, the APD shown in FIG. 9, and therefore a protective film 711 for covering these exposed sections is required to be formed. Conventionally such protective film 711 is known as the method for forming thereof with an insulating film of an organic compound such as a polyimide resin film, a benzocyclobutene resin film and the like, or an insulating film of an inorganic compound such as a silicon nitride film, a silicon oxide films and the like. Here, in FIG. 9, reference numeral 712 indicates an antireflection AR coating, 701 indicates a substrate, 702 indicates a buffer layer, 704 indicates a field buffer layer, 706 indicates a cap layer, 707 indicates a contact layer, and 708 and 709 indicate electrodes.

[Patent Document 1]
Japanese Patent Laid-Open No. 2000-22, 197
[Non-Patent Document 1]
ELECTRONICS LETTERS, Vol. 20, No. 16, pp. 654-656, 1984
[Non-Patent Document 2]
IEEE TRANSACTIONS ON ELECTRON DEVICES, Vol. 50, No. 2, pp. 532-534, 2003
[Non-Patent Document 3]
IEEE PHOTONICS TECHNOLOGY LETTERS, Vol. 8, No. 6, pp. 827-829, 1996

DISCLOSURE OF THE INVENTION

As described above, in order to achieve a semiconductor light receiving element having enhanced performances and enhanced reliability characteristics with improved processibility and lower cost, an employment of a mesa structure, which provides easier control of the device characteristics and improved reproducibility, is effective. However, a technology for providing a protection for the exposed semiconductor sections in the mesa side surface is essential for the mesa structure. In particular, in the semiconductor light receiving element composed of a compound semiconductor, there are the following problems in the protective film covering the mesa side surface in the conventional technology, and this leads to problems in the device characteristics or the reliability.

First of all, since a film-forming process such as a spin coating process and the like is applicable for the semiconductor light receiving element having the mesa structure including the protective film formed of an organic compound-based insulating film, it is advantageous to cause less damage such as a generation of a defect in the manufacturing operation. However, on the other hand, since the organic compound-based insulating film exhibits insufficient chemical resistance, insufficient solvent resistance, and insufficient moisture resistance or the like, this leads to a problem of deteriorating device characteristics and reliability.

Further, in the semiconductor light receiving element having the mesa structure including the protective film formed of the inorganic compound-based insulating film, the semiconductor surface exposed in the mesa side surface, and further, an interface between the semiconductor surface and the protective film, are easily affected by the conditions for forming the films and the quality of the protective film, causing a problem in its stability.

Figure 9:
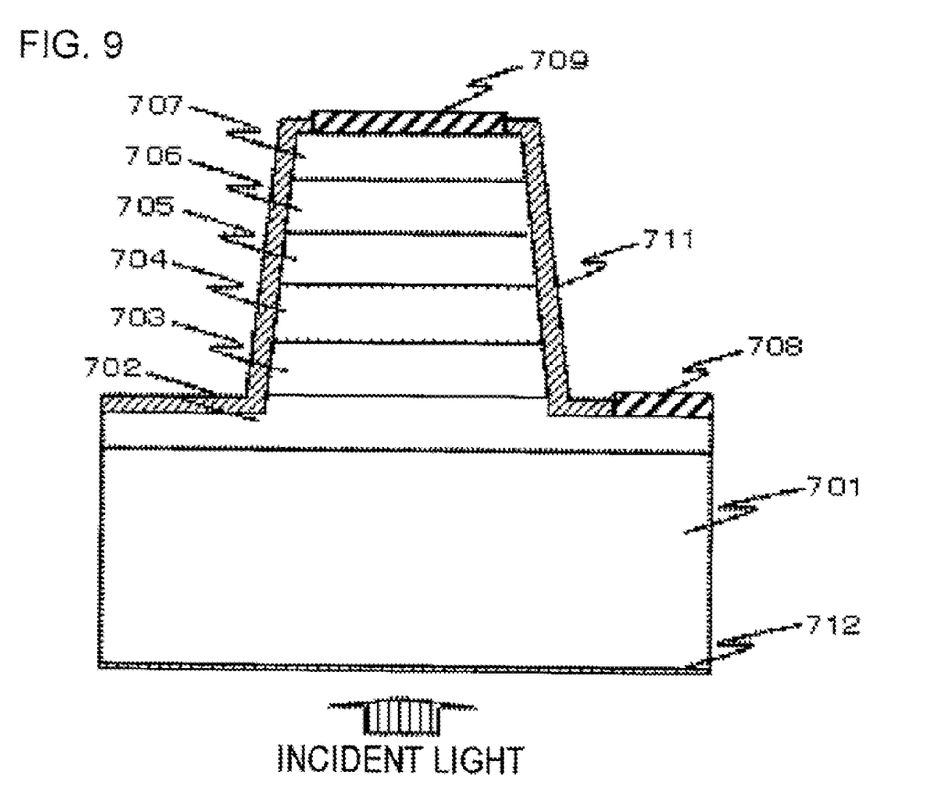
[FIG. 9] It is a cross-sectional view, illustrating a semiconductor light receiving element.

For example, an investigation for a case of forming a protective film 711, which is composed of a silicon nitride film formed with source materials of $SiH_4$ and $NH_3$ on the mesa side surface, will be conducted for the APD having the mesa structure including the photo-absorption layer 705, the multiplication layer 703, and the field buffer layer 704 or the like formed on the substrate 701 as shown in FIG. 9. Hydrogen radical generated in the film formation process is taken in the surface of the semiconductor layer (photo-absorption layer 705, multiplication layer 703, field buffer layer 704 or the like) of the mesa side surface, and/or an interface between the semiconductor layer surface and the protective film 711. This causes a generation of a leakage current in the surface of the semiconductor layer and in the interface between the surface of the semiconductor layer and the protective film 711, and/or deterioration in the carrier density in the semiconductor layer.

Figure 10:
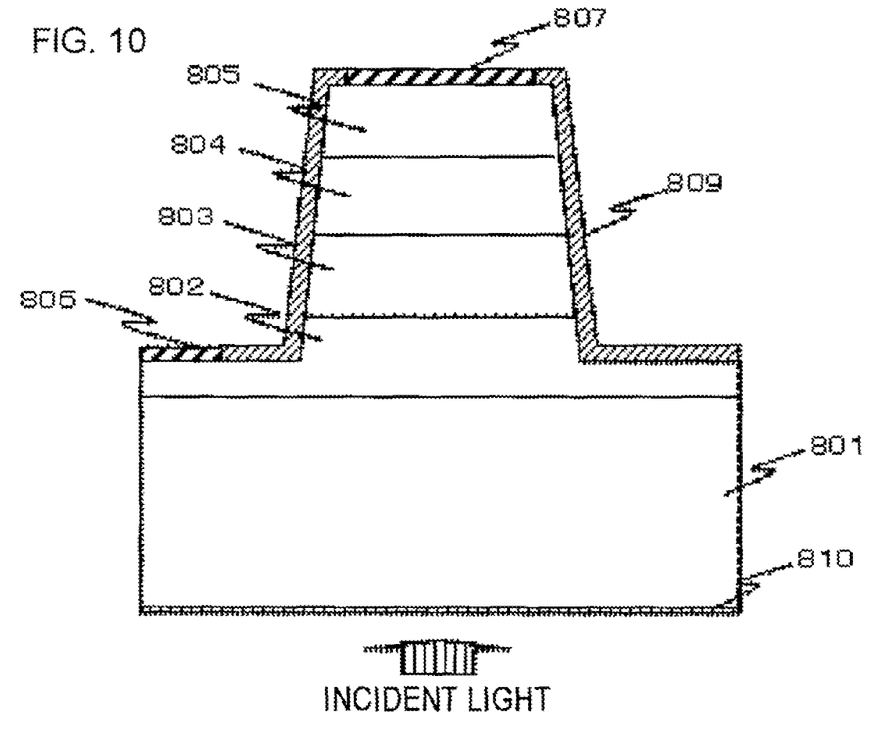
[FIG. 10] It is a cross-sectional view, illustrating a semiconductor light receiving element.

Similar deteriorations are also caused in a PIN-PD shown in FIG. 10, which has no multiplication layer. The PIN-PD shown in FIG. 10 includes an n-type buffer layer 802, an i-type layer 803, a p-type layer 804, and a p-type contact layer 805 formed on an n-type substrate 801. Reference numerals 806 and 807 indicate electrodes, and reference numeral 809 indicates a protective film. Further, reference numeral 810 indicates an AR coating. Since a generation of leakage current or the like may cause deteriorations in the reliability or in the device characteristics, control of hydrogen radical is a critical target for applying the protective film having the mesa structure.

Here, while another approach is proposed, in which a regrowth of a semiconductor layer with higher resistance is conducted after the mesa structure is formed, in addition to the above-described insulating film, to provide a protection of the mesa side surface, such approach may also require very complex manufacturing process, causing a problem in the production yield and the cost.

The present invention is to provide a semiconductor light receiving element, which allows preventing a degradation of the reliability and deterioration in the device characteristics without a need for a complicated manufacturing process.

According to one aspect of the present invention, there is provided a semiconductor light receiving element, comprising: a semiconductor substrate; and a semiconductor layer including a photo-absorption layer disposed over the semiconductor substrate, wherein the semiconductor layer containing at least the photo-absorption layer has a mesa structure, wherein a side wall of the mesa is provided with a protective film covering the side wall, wherein the protective film is a silicon nitride film containing hydrogen, and wherein a hydrogen concentration in one surface of the protective film located at the side of the mesa side wall is lower than a hydrogen concentration in the other surface of the protective film located at the side that is opposite to the side of the mesa side wall.

According to the present invention, a semiconductor light receiving element, which allows preventing a degradation of the reliability and deterioration in the device characteristics without a need for a complicated manufacturing process, can be presented.

BRIEF DESCRIPTION OF THE DRAWINGS

The above and other objects, advantages and features of the present invention will be more apparent from the following description of certain preferred embodiments taken in conjunction with the accompanying drawings, in which.

BEST MODE FOR CARRYING OUT THE INVENTION

Preferable embodiments of the present invention will be described in reference to the annexed figures. In all figures, an identical numeral is assigned to an element commonly appeared in the figures, and the detailed description thereof will not be repeated.

(First Embodiment)

Figure 1:
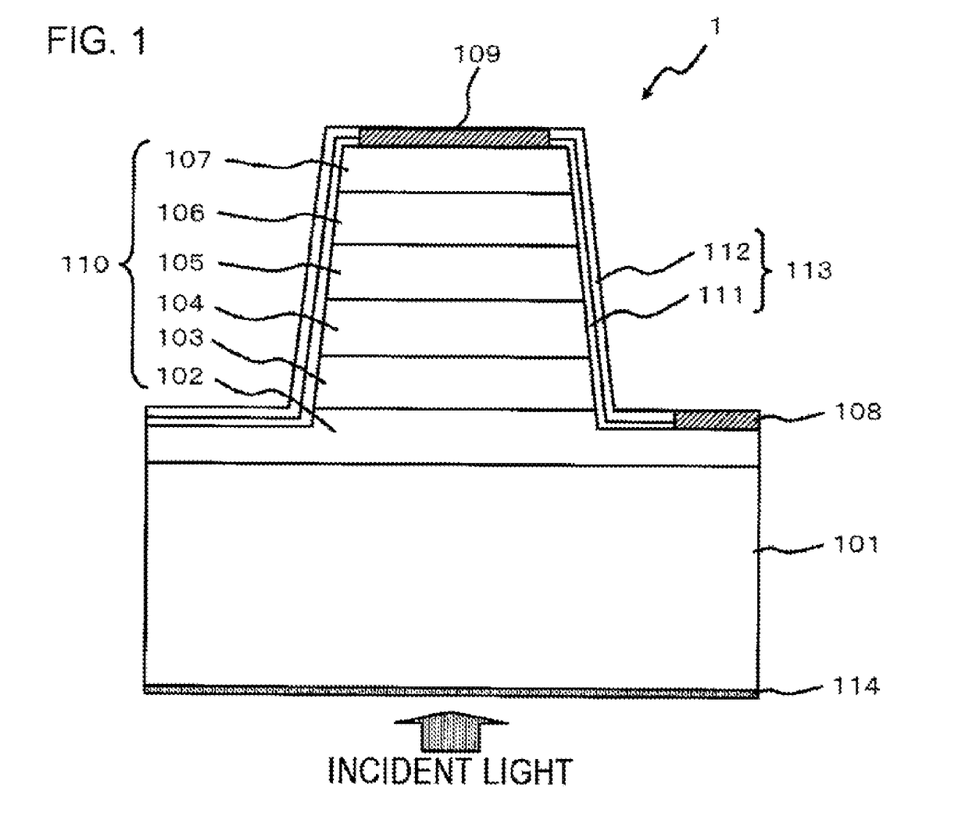
[FIG. 1] It is a cross-sectional view, illustrating a semiconductor light receiving element according to first embodiment of the present invention.

A semiconductor light receiving element of first embodiment of the present invention will be described in reference to FIG. 1. In the beginning, an overview of a semiconductor light receiving element 1 will be described. The semiconductor light receiving element 1 includes a semiconductor substrate 101, and a semiconductor layer having a photo-absorption layer 105 disposed on the semiconductor substrate 101. The semiconductor layer of the semiconductor light receiving element 1 containing at least the photo-absorption layer 105 has a mesa structure, and a side wall of the mesa is provided with a protective film 113 covering the side wall. The protective film 113 is a silicon nitride film containing hydrogen, and a hydrogen concentration (concentration of atomic hydrogen) in one surface of the protective film 113 located at the side of the mesa side wall is lower than a hydrogen concentration (concentration of atomic hydrogen) in the other surface of the protective film 113 located at the side that is opposite to the side of the mesa side wall.

Next, the semiconductor light receiving element 1 will be described in detail. The semiconductor light receiving element 1 is a surface illuminated type mesa-structured APD. As shown in FIG. 1, it is configured that an n-type InP buffer layer 102, an InAlAs multiplication layer (avalanche multiplication layer) 103, a p-type InAlAs field buffer layer 104, an InGaAs photo-absorption layer 105; a p-type InAlAs cap layer 106, and a p-type InGaAs contact layer 107 are consecutively stacked over an n-type InP substrate (semiconductor substrate) 101. A light receiving region 110 is formed by forming a mesa structure by a wet etching process or a dry etching process. AR coating 114 is provided on the back surface of the substrate 101.

The side wall of the mesa serving as the light receiving region 110 is coated with the protective film 113 composed of multiple layers. More specifically, the side wall of the mesa is coated with the protective film 113 of dual-layer configuration composed of a first silicon nitride film 111 and a second silicon nitride film 112 formed on the first silicon nitride film 111. The first silicon nitride film 111 is direct contact with the side wall of the mesa.

A hydrogen concentration in the first silicon nitride film 111 is lower than a hydrogen concentration in the second silicon nitride film 112 serving as the top layer. More specifically, a hydrogen concentration in the first silicon nitride film 111 is equal to or higher than $5\times10^{21}$ (atoms/cm$^3$) and equal to or lower than $1\times10^{22}$ (atoms/cm$^3$), and a hydrogen concentration of the second silicon nitride film 112 is preferably equal to or higher than 2 folds of, and equal to or lower than 10 folds of, the hydrogen concentration in the first silicon nitride film 111.

The first silicon nitride film 111 is, for example, a film deposited by a plasma chemical vapor deposition (plasma CVD) process employing SiH$_4$ gas as a silicon source and employing N$_2$ gas and/or NH$_3$ gas as a nitrogen (N) source. Such combination of the source gases allows reducing atomic hydrogen (H) involved in the deposition process, and easily reducing the generation of hydrogen radical. In addition to above, the use of NH$_3$ gas alone for the nitrogen (N) source also allows to deposit a film with the quality which is equivalent to that deposited by using N$_2$ gas alone, by suitably controlling the process conditions such as composition of the gas for the deposition (for example, changing the flow rate of a dilution gas such as argon (Ar) gas to adjust the efficiency of the decomposition of the source gas), pressure, radio frequency (RF) power and the like.

The second silicon nitride film 112 is formed directly on the first silicon nitride film 111. The second silicon nitride film 112 is, for example, a film deposited by a plasma CVD process employing SiH$_4$ gas as a silicon source and employing NH$_3$ gas as a nitrogen (N) source. Here, the process conditions such as composition of the gas for the deposition, pressure, RF power and the like are suitably controlled, so that the concentration of atomic hydrogen contained in the second silicon nitride film 112 is higher than the concentration of atomic hydrogen in the first silicon nitride film 111. In addition to above, it is preferable to use a raw material as the nitrogen source of second silicon nitride film 112, which contains higher content of atomic hydrogen than the nitrogen source for the first silicon nitride film 111.

Here, the thickness of the protective film 113 may be preferably equal to or smaller than 0.8 μm, and preferably equal to or larger than 0.1 μm. In addition, the first silicon nitride film 111 may have a thickness of preferably equal to or larger than 0.1 μm and equal to or smaller than 0.5 μm. Further, the second silicon nitride film 112 may have a thickness of preferably equal to or larger than 0.1 μm and equal to or smaller than 0.5 μm. The thickness of each of the silicon nitride films 111 and 112 of equal to or smaller than 0.5 μm allows providing an advantageous effect of reducing the stress over the semiconductor layer. On the other hand, the thickness of each of the silicon nitride films 111 and 112 of equal to or larger than 0.1 μm ensures the protection for the mesa structure by the protective film 113.

An n-type electrode 108 and a p-type electrode 109 are formed on the top of the n-type InP buffer layer 102 and on the top of the p-type InGaAs contact layer 107, respectively.

Next, advantageous effect of the semiconductor light receiving element 1 of the present embodiment will be described. In the semiconductor light receiving element 1 of the present embodiment, a hydrogen concentration in one surface of the protective film 113 located at the side of the mesa side wall is lower than a hydrogen concentration in the other surface of the protective film 113 located at the side that is opposite to the side of the mesa side wall. Such lower hydrogen concentration of one surface of the protective film 113 at the side of the mesa side, wall provides an inhibition to deteriorations in the device characteristics and the device life due to hydrogen radical. On the other hand, such higher hydrogen concentration of the other surface of the protective film 113 in the other side opposite to the side of the mesa side wall also provides an inhibition to deteriorations in the device characteristics and the device life due to penetration of water or the like and oxidation. As shown in FIG. 1, side surfaces of the respective semiconductor layers, namely the n-type InP buffer layer 102, the InAlAs multiplication layer 103, the p-type InAlAs field buffer layer 104, the InGaAs photo-absorption layer 105, the p-type InAlAs cap layer 106 and the p-type InGaAs contact layer 107, are exposed in the mesa side wall of the light receiving region 110. Thus, when a silicon nitride film, which serves as the protective film 113, is formed after forming the mesa structure, the semiconductor surfaces of the side wall of the mesa are exposed to a source gas atmosphere and a plasma. If the rate of the generation of hydrogen radical is higher during deposition of the silicon nitride film, hydrogen radical is taken within the semiconductor layer or in interfaces of the semiconductor surfaces with the silicon nitride film during such deposition process, so that carrier density is decreased in the InAlAs multiplication layer 103 and in the p-type InAlAs field buffer layer 104, or a leakage current is generated in an interface of the semiconductor layer and the first silicon nitride film 111. The carrier density in the InAlAs multiplication layer 103 and in the p-type InAlAs field buffer layer 104 is a parameter that requires a strict control in the principle of the operation of the APD, and therefore such decrease in the carrier density may cause deteriorated device characteristics of the APD and/or increased leakage current in the mesa side wall. Further, the InGaAs photo-absorption layer 105 has particularly smaller band gap (0.75 eV) in the semiconductor layers constituting APD, which leads to a easy generation of tunneling current, and thus a leakage current is easily generated in the interface with the silicon nitride film and the layer is easily affected by hydrogen radical.

Since the first silicon nitride film 111, the deposition of which is started in the state that the semiconductor layers of the mesa side wall are exposed, is formed of the silicon nitride film having lower hydrogen concentration in the film as compared with the second silicon nitride film 112 so as to reduce the generation of hydrogen radical in the deposition process in the present embodiment, deteriorations in the device characteristics and the device life due to forming of the above-described silicon nitride film are inhibited. In addition to above, since the semiconductor light receiving element 1 composed of semiconductor layers composed of III-V group semiconductors are in particular easily affected by hydrogen radical, it is particularly useful to provide the first silicon nitride film 111 having lower hydrogen concentration.

Figure 7:
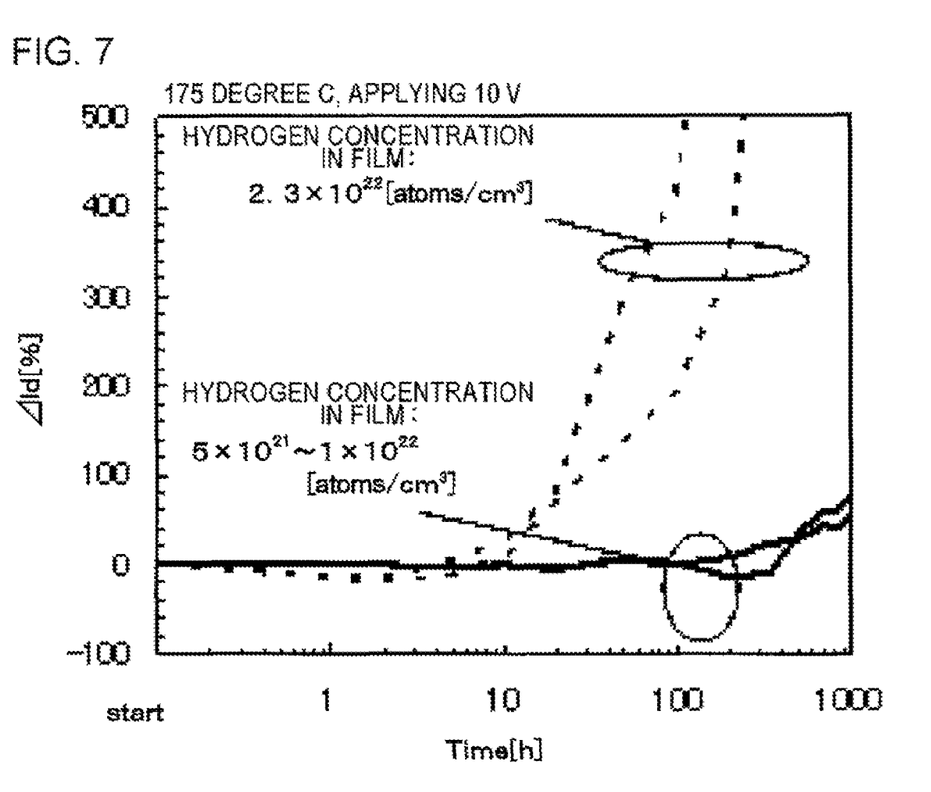
[FIG. 7] It is a graph, showing time-variation of dark current by high temperature energization through the semiconductor light receiving element.
Figure 8:
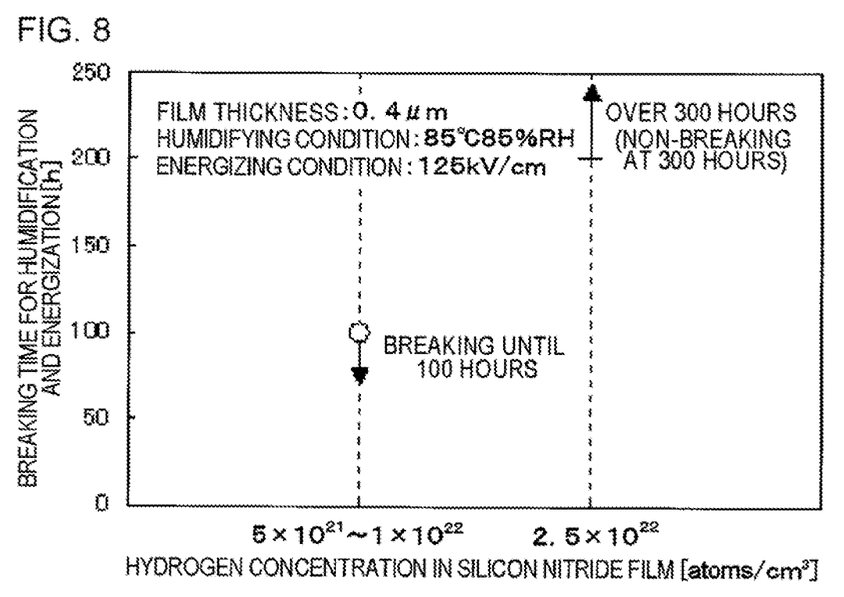
[FIG. 8] It is a graph, showing breaking time of a semiconductor light receiving element under the condition of humidification and energization.

On the other hand, since the first silicon nitride film 111 contains lower content of atomic hydrogen in the film, a number of bonds in non-bonded state are present, providing less dense film. This results that, for example, an oxidation and a permeation of water from the film surface exposed to environmental atmosphere is easily occurred, when the protective film 711 of the mesa structure APD having the photo-absorption layer 705 and the multiplication layer 703 is formed of only the above-described silicon nitride film having lower hydrogen concentration in the film alone as shown in FIG. 9, and thus a deterioration in the device characteristics and a degradation of the reliability resulted from other factors than the presence of hydrogen radical is caused. FIG. 7 shows a relation of the device life of the PIN-PD having the mesa structure and the hydrogen concentration in the silicon nitride film serving as the protective film, and FIG. 8 shows a relation of the humidification resistance of the PIN-PD having the mesa structure and the hydrogen concentration in the silicon nitride film serving as the protective film. FIG. 7 is a graph, showing time-variation of the dark current by the high temperature energization through the semiconductor light receiving element. Ordinate in FIG. 7 represents an increase rate of the dark current of the device, and larger value indicates larger deterioration. As can be seen from FIGS. 7 and 8, the device including the film having lower hydrogen concentration allows longer device life but deteriorated resistance for humidification. Besides, the device including the film having higher hydrogen concentration allows shorter device life but increased resistance for humidification.

On the contrary, in the present embodiment, the silicon nitride film 112 having higher hydrogen concentration in the film (preferably equal to or higher than 2 folds of, and equal to or lower than 10 folds of, the hydrogen concentration in the first silicon nitride film 111) is formed on first silicon nitride film 111. Such second silicon nitride film 112 having higher hydrogen concentration provides dense film, and contains less bonds in non-bonded state. Thus, molecular or atomic migration of water or oxygen through bonds in non-bonded state is less occurred, and therefore a permeation of water from the film surface or an oxidation is inhibited. For example, in the mesa-structure APD like the structure as described the present embodiment, decomposition/deterioration due to a submersion in the interface of the InP layer with the silicon nitride film is reported, and thus a prevention of a permeation of water from the film surface of the second silicon nitride film 112 is particularly critical for the reliability.

The hydrogen concentration for the first silicon nitride film 111 is $5 \times 10^{21}$ to $1 \times 10^{22}$ [atoms/cm$^3$]. This is because, when the silicon nitride film is employed for the protective film of the mesa side wall, the life of the light receiving element is highly possibly reduced once the hydrogen concentration is reached to $1 \times 10^{22}$ [atoms/cm$^3$]. However, if the film has extremely low hydrogen concentration of lower than $1 \times 10^{21}$ [atoms/cm$^3$], it is possible to form less dense silicon nitride film. In this case, a primary effect of the protective film to cover the mesa side wall may be possibly reduced and the device characteristics may be possibly deteriorated, it is preferable to maintain the range of from $5 \times 10^{21}$ to $1 \times 10^{22}$ [atoms/cm$^3$], even if the film containing low concentration of hydrogen is employed.

Further, the concentration of hydrogen in the second silicon nitride film 112 may be preferably equal to or higher than twice of, and equal to or lower than 10 times of, the concentration of hydrogen in the first silicon nitride film 111. The concentration of hydrogen of second silicon nitride film 112 is selected to be equal to or larger than 2 folds of the concentration of hydrogen in the first silicon nitride film 111 to provide an advantageous effect of providing improved humidification resistance. In addition, the concentration of hydrogen of second silicon nitride film 112 is selected to be equal to or lower than 10 folds of the concentration of hydrogen in the first silicon nitride film 111 to provide an advantageous effect of a generation of a crack and a flaking off due to a considerably different film stress from that of the first silicon nitride film 111 can be inhibited.

Since a stress to the semiconductor due to a compressive stress internally generated in the silicon nitride film serves as a factor for deterioration of the device characteristics and for deterioration of the reliability when the silicon nitride film is employed for the protective film of the semiconductor, it is necessary to control to the effective thickness. The semiconductor light receiving element 1 of the present embodiment includes the semiconductor layer composed of compound semiconductor such as InP, InGaAs, InAlAs and the like, which exhibits lower hardness as compared with silicon (Si) or the like, and is vulnerable to the internal stress in the protective film. Thus, when the protective film is formed of a silicon nitride film having a thickness of about 1 μm over the mesa side wall of the mesa-structure APD, a leakage current is generated in the interface of the semiconductor and the protective film resulted from the stress in the protective film, possibly causing deteriorations in the device characteristics and the device life. On the other hand, the extremely reduced film thickness of the protective film of typically smaller than 0.1 μm may possibly reduce the protection ability for penetration of water or oxygen from the surface of the protective film. It is preferable for the semiconductor light receiving element 1 to have a thickness for preventing a deterioration in the device characteristics or in the device life due to the stress in the protective film of, a grand total of the thicknesses of the respective silicon nitride films is equal to or smaller than 0.8 μm and equal to or larger than 0.1 μm.

Further, since the protective film 113 of the present embodiment is configured of the silicon nitride film, it can be formed via a plasma CVD process, which avoids complicated process for manufacturing the semiconductor light receiving element 1. The semiconductor light receiving element 1 can be installed on equipments such as an optical communication equipment, an optical data processing equipment, and optical measurement equipments and the like to achieve enhanced performances of the equipments.

(Second Embodiment)

Figure 2:
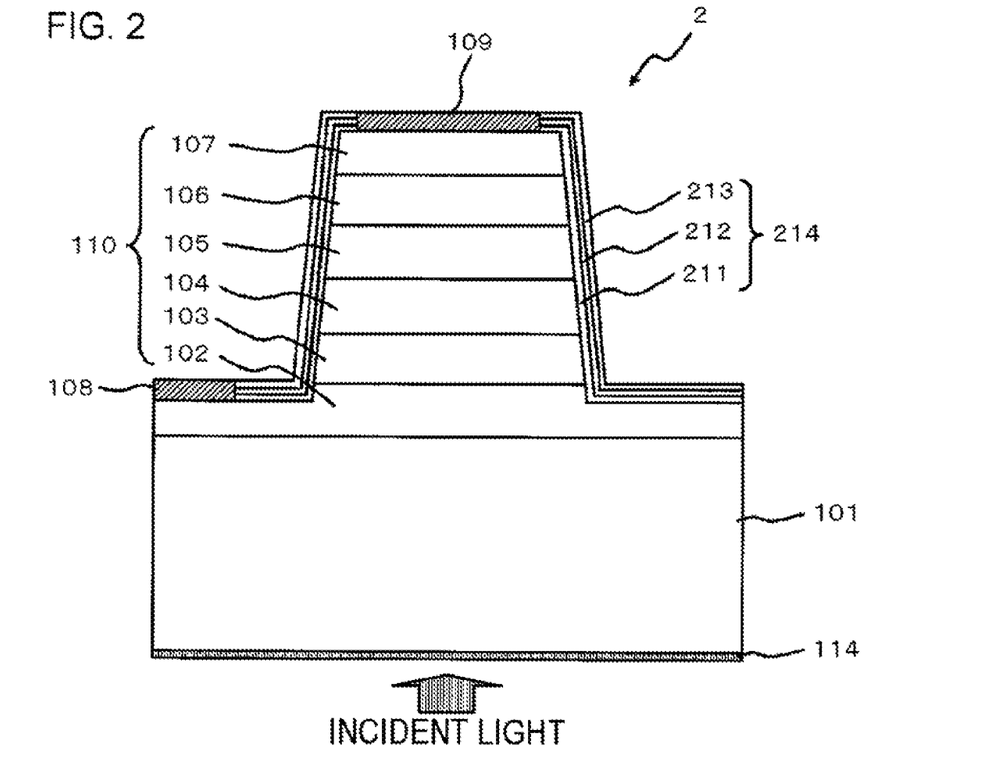
[FIG. 2] It is a cross-sectional view, illustrating a semiconductor light receiving element according to second embodiment of the present invention.

Next, second embodiment will be described in reference to FIG. 2. A structure of a protective film 214 of a semiconductor light receiving element 2 of the present embodiment is different from the protective film of the semiconductor light receiving element 1 in the above-described embodiment. Other configurations are similar to that of first embodiment. More specifically, the side wall of the mesa section serving as the light receiving region 110 is covered with a multilayer protective film 214 composed of three or more layers including a silicon nitride film 211, an intermediate protective film 212 formed on the silicon nitride film 211 and composed of one or more silicon nitride film(s), and a silicon nitride film 213 constituting an uppermost surface formed on the intermediate protective film 212.

In this case, the silicon nitride film 211 may be manufactured by a similar method as employed for the first silicon nitride film 111 in first embodiment. A hydrogen concentration in the silicon nitride film 211 is preferably equal to or higher than $5 \times 10^{21}$ (atoms/cm$^3$) and equal to or lower than $1 \times 10^{22}$ (atoms/cm$^3$). A thickness of the silicon nitride film 211 is preferably, for example, equal to or larger than 0.1 μm and equal to or smaller than 0.5 μm. The silicon nitride film 211 is in direct contacts with the side wall of the mesa.

The silicon nitride film 213 which is the uppermost surface contains higher concentration of hydrogen (preferably equal to or higher than 2 folds of, and equal to or lower than 10 folds of, the hydrogen concentration in the silicon nitride film 211). The silicon nitride film 213 may be manufactured by a similar method as employed for the silicon nitride film 112 in first embodiment. The silicon nitride film 211 is preferably, for example, equal to or larger than 0.1 μm and equal to or smaller than 0.5 μm.

The intermediate protective film 212 may be of a single layer, or of multiple layers. A hydrogen concentration in the intermediate protective film 212 is not particularly limited, and may be equal to or higher than the hydrogen concentration in the silicon nitride film 211, and further, may be equal to or higher than the hydrogen concentration in the silicon nitride film 213. For example, when the hydrogen concentration in the intermediate protective film 212 is provided as being higher than the hydrogen concentration in the silicon nitride film 211 and lower than the hydrogen concentration the silicon nitride film 213, improved water resistance and oxidation resistance may be achieved. Further, since the hydrogen concentration in the intermediate protective film 212 is lower than the hydrogen concentration in the silicon nitride film 213, an increase in the film stress can be inhibited, as compared with the case for forming the silicon nitride film 213 having a thickness including the intermediate protective film 212 (the region of the intermediate protective film 212 is changed to be the silicon nitride film 213). On the other hand, when the hydrogen concentration in the intermediate protective film 212 is provided as being equal to or higher than the hydrogen concentration in the silicon nitride film 213, the water resistance and the oxidation resistance can be firmly improved. In addition to above, in such case, the thickness of the intermediate protective film 212 may be suitably adjusted according to the film stress. Further, when the hydrogen concentration in the intermediate protective film 212 is provided as being lower than the hydrogen concentration in the silicon nitride film 211, this leads to a formation of a film having significantly smaller film stress, thus providing a measure for reducing the stress exerted to the semiconductor layer. The thickness of the protective film 214 may be, similarly as in the above-described embodiment, preferably equal to or smaller than 0.8 μm, and preferably equal to or larger than 0.1 μm. According to the above-described second embodiment, the advantageous effect similarly as in first embodiment can be exhibited.

(Third Embodiment)

Figure 3:
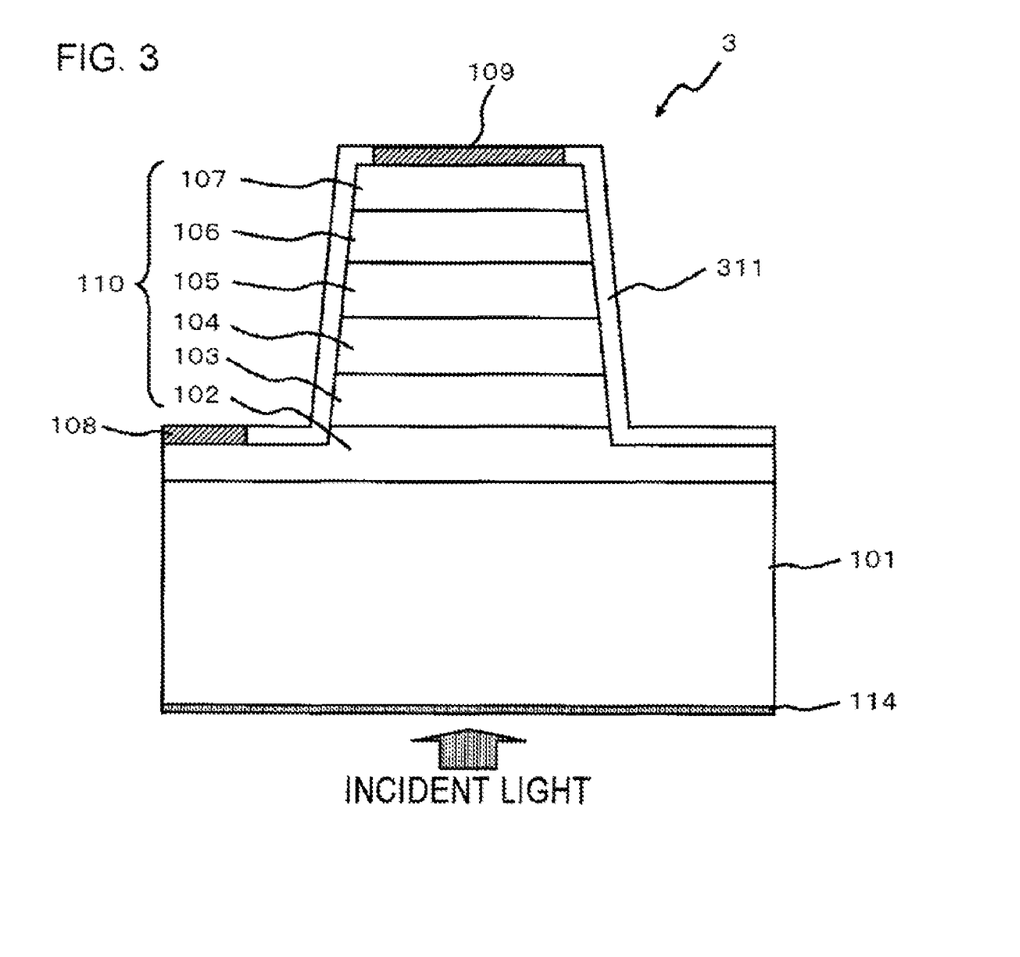
[FIG. 3] It is a cross-sectional view, illustrating a semiconductor light receiving element according to third embodiment of the present invention.

Third embodiment will be described in reference to FIG. 3. In the semiconductor light receiving element 3 of the present embodiment, the structure of a protective film 311 is different from the protective film 113 of the semiconductor light receiving element 1 in the above-described embodiment. Other configurations are similar to that of first embodiment. The side wall of the mesa section serving as the light receiving region 110 is covered with a protective film that is composed of a single piece of a silicon nitride film 311, in which a hydrogen concentration in the film is distributed so as to continually increase or stepwise increase from a surface at the side of the mesa side wall toward an uppermost surface.

In such case, the silicon nitride film 311 is deposited via a plasma chemical vapor deposition (plasma CVD) process employing $NH_3$ gas or a combination of $N_2$ gas and $NH_3$ gas for a nitrogen (N) source, and the deposition conditions such as a gas flow rate a pressure, a source gas partial pressure, a temperature, an RF power and the like in the deposition process are continually or stepwise changed to provide a distribution of the hydrogen concentration in the film, which continually varies or stepwise varies in two or more steps. The concentration of atomic hydrogen contained in a first region of the silicon nitride film 311, which includes a surface of the silicon nitride film 311 located at the side of the mesa side wall, is provided to be lower than the concentration of atomic hydrogen in a second region of the silicon nitride film 311, which includes a surface of the silicon nitride film 311 located in the side opposite to the mesa side wall. The deposition in the present embodiment is conducted so as to provide that the hydrogen concentration in the film at the side of the semiconductor surface of the mesa side wall (initial stage of the deposition for the silicon nitride film) is lower and the hydrogen concentration in the film is increased toward the side of the uppermost surface. The hydrogen concentration per unit volume in the first region containing the surface at the side of the mesa side wall may be preferably equal to or higher than $5 \times 10^{21}$ (atoms/cm$^3$) and equal to or lower than $1 \times 10^{22}$ (atoms/cm$^3$). Further, the hydrogen concentration per unit volume in the second region containing the uppermost surface may be preferably equal to or higher than 2 folds of, and equal to or lower than 10 folds of, the hydrogen concentration in the first region.

Figure 4:
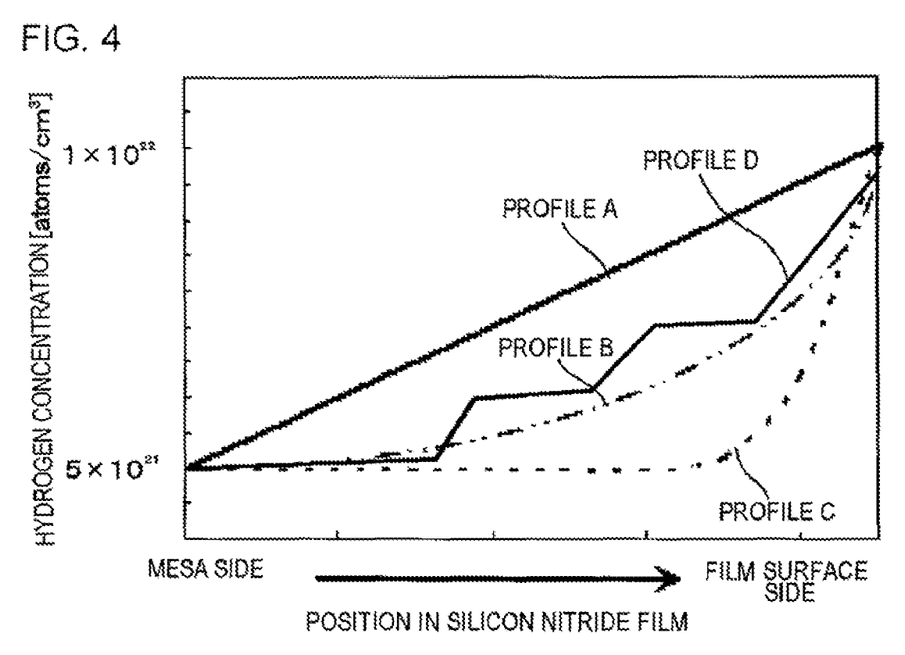
[FIG. 4] It is a graph, showing hydrogen concentration distribution of the protective film in third embodiment.

FIG. 4 shows an example of a profile of the hydrogen concentration in the silicon nitride film. Profile A presents that the hydrogen concentration increases continually by a constant quantity from the side of the mesa side wall toward the side of the top layer so as to be proportional to the dimension of the thickness from the mesa of the silicon nitride film. Profile B presents that the hydrogen concentration increases continually from the side of the mesa side wall toward the side of the top layer, and in turn, the hydrogen concentration rapidly increases from a certain point. Profile C presents that substantially no increase is made in the hydrogen concentration from the side of the mesa side wall to a predetermined position, and in turn, the hydrogen concentration rapidly increases from a certain point.

Profile D presents that the hydrogen concentration increases stepwise from the side of the mesa side wall. The thickness of the protective film 311 may be, similarly as in the above-described embodiments, preferably equal to or smaller than 0.8 μm, and preferably equal to or larger than 0.1 μm.

According to the above-described third embodiment, the advantageous effect similarly as in first embodiment can be exhibited, and additionally the following advantageous effects can be exhibited. Since the protective film 311 is composed of a single piece of film in the present embodiment, the deposition of the protective film 311 can be conducted by a single process, and thus the manufacture of the semiconductor light receiving element 3 requires no complex process.

(Fourth Embodiment)

Figure 5:
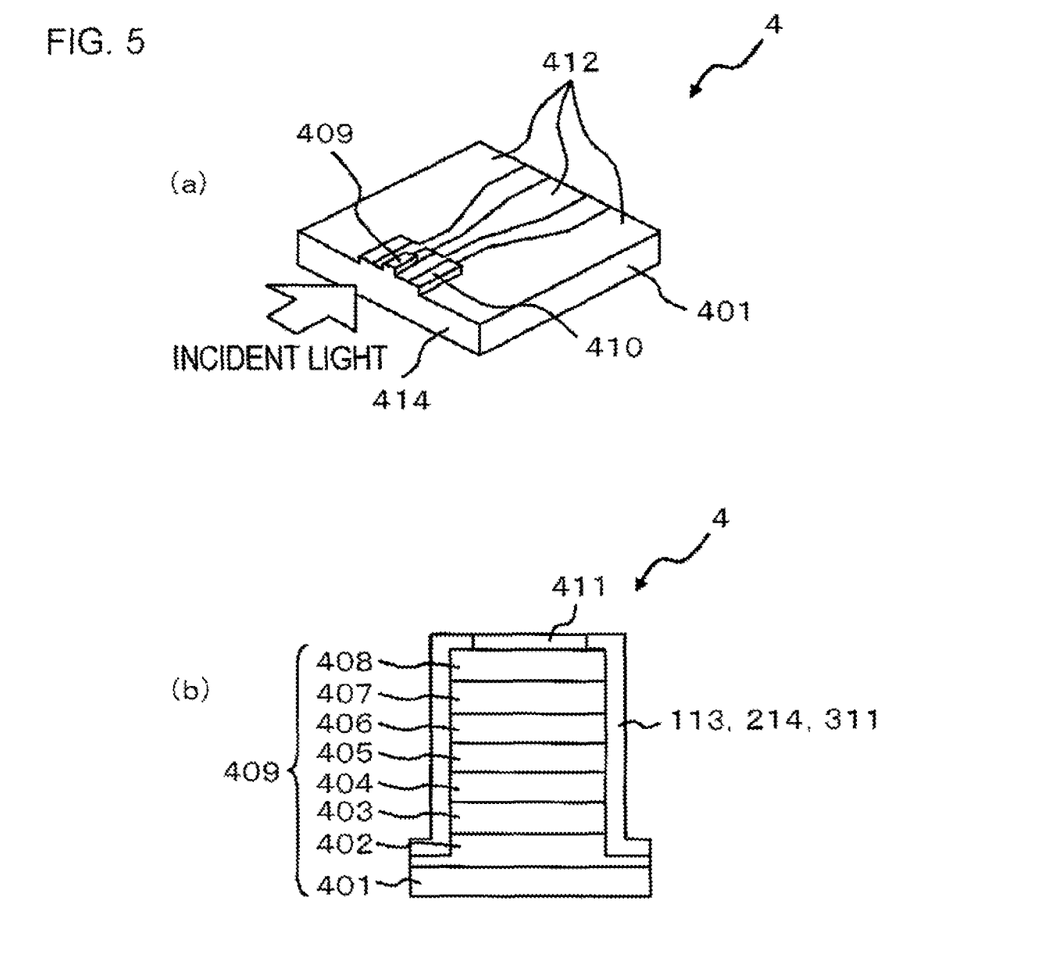
[FIG. 5] It includes diagrams, illustrating a semiconductor light receiving element according to fourth embodiment of the present invention.

A semiconductor light receiving element 4 of fourth embodiment will be described in reference to FIG. 5. The semiconductor light receiving element 4 is a waveguiding structure APD of edge illuminated type. FIG. 5 (a) is a perspective view of the semiconductor light receiving element 4, and FIG. 5 (b) is a schematic diagram, showing a main part of the semiconductor light receiving element 4. The semiconductor light receiving element 4 is configured that an n-type InP buffer layer 402, an n-type InAlGaAs guide layer 403, an InAlAs multiplication layer 404, a p-type InAlAs field buffer layer 405, an InGaAs photo-absorption layer 406, a p-type InAlGaAs guide layer 407, and a p-type InGaAs contact layer 408 are consecutively stacked on an InP substrate 401 that serves as a semiconductor substrate, and a light receiving region 409 is formed by forming a mesa structure via a wet etching or a dry etching process. An n-type electrode 410 and a p-type electrode 411 are formed on the top of the n-type InP buffer layer 402 and on the top of the p-type InGaAs contact layer 408, respectively. The side wall of the mesa section serving as the light receiving region 409 is coated with the protective film 113, the protective film 214 or the protective film 311. The semiconductor layer is exposed at the side wall section of the mesa structure constituting the light receiving region in the waveguiding structure APD, similarly as in the above-described mesa-structure APD of the surface illuminated type, and the formation of the protective film covering the mesa side wall is critical in terms of the device characteristics and the device life. Further, electrode interconnects 412 are formed on the semiconductor substrate 401 of the semiconductor light receiving element 4, and an anti-reflective film (AR film) 414 is formed over an end surface at a light-incident side of the semiconductor light receiving element 4.

According to fourth embodiment, the advantageous effects similarly as in first embodiment to third embodiment can be exhibited. In addition to above, when the protective film 311 is employed in the present embodiment, the following advantageous effects can be exhibited. The semiconductor light receiving element 4 of the present embodiment is configured to be an edge illuminated type, or more specifically, is in a structure, in which light beam enters through the side wall of the mesa. Therefore, the reflectivity for incident light to the end surface (side wall of a mesa) can be adjusted by employing a multilayer configuration for the protective film as employing the protective film 311. This allows receiving light by the semiconductor light receiving element 4 with an improved efficiency.

(Fifth Embodiment)

Figure 6:
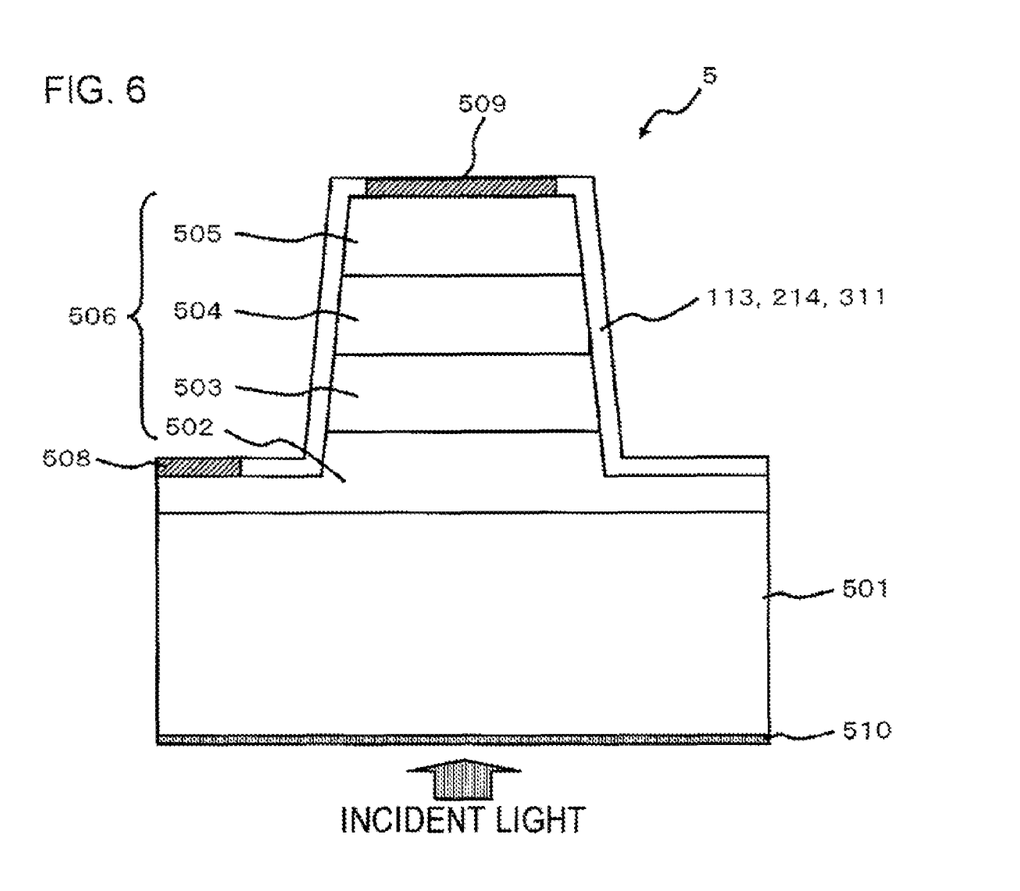
[FIG. 6] It is a cross-sectional view, illustrating a semiconductor light receiving element according to fifth embodiment of the present invention.

A semiconductor light receiving element 5 of fifth embodiment will be described in reference to FIG. 6. The semiconductor light receiving element 5 is a mesa-structure PIN-PD. As show in FIG. 6, the semiconductor light receiving element 5 is configured that an n-type InP buffer layer 502, an undoped InGaAs layer 503, a p-type InP layer 504, and a p-type InGaAs contact layer 505 are consecutively stacked on an n-type InP substrate 501 serving as a semiconductor substrate, and the light receiving region 506 is formed by forming a mesa structure via a wet etching or a dry etching process. The side wall of the mesa section serving as the light receiving region 506 is coated with the protective film 113, the protective film 214 or the protective film 311. An n-type electrode 508 and a p-type electrode 509 are formed on the top of the n-type InP buffer layer 502 and on the top of the p-type InGaAs contact layer 505, respectively. The semiconductor layer is exposed at the side wall section of the mesa structure constituting the light receiving region in the mesa-structure PIN-PD, similarly as in the above-described mesa-structure APD, and the formation of the protective film to a p-n junction that exposes at the mesa side wall and an InGaAs layer serving as a photo-absorption layer is particularly critical in terms of the device characteristics and the device life. According the semiconductor light receiving element of fifth embodiment, the advantageous effects similarly as in first embodiment to fourth embodiment can be exhibited. In addition to above, similar advantageous effects can also be achieved in semiconductor light receiving element which is a PIN-PD having a waveguiding structure which is an edge illuminated type.

It is apparent that the present invention is not limited to the above embodiment, and may be modified and changed without departing from the scope and spirit of the invention. For example, while the InAlAs layer is employed as a multiplication layer in first embodiment to fourth embodiment, the multiplication layer constituting the semiconductor light receiving element of the present invention is not limited thereto, and an element structure employing a superlattice layer or a single bulk layer, which is composed of InP, InGaAsP, InAlAs, InAlGaAs, GaAs, AlGaAs, GaSb or AlGaAsSb, may be employed. Further, while the semiconductor light receiving elements in first embodiment to third embodiment and fifth embodiment in the present invention employs the element for light entering from the back surface of the semiconductor, an invert structure for light entering from the front surface of the semiconductor may be employed.

Further, the semiconductor light receiving element is not limited to above-described exemplary implementations, and the semiconductor layer including the photo-absorption layer may preferably be configured to include a group III-V compound semiconductor. The present application is based on, and claims priority of, Japanese Patent Application No. 2007-334,669 filed 26 Dec. 2007, the disclosure of which is hereby incorporated by reference herein in its entirety.

The invention claimed is:

1. A semiconductor light receiving element, comprising:
a semiconductor substrate; and
a semiconductor layer including a photo-absorption layer disposed over the semiconductor substrate,
wherein the semiconductor layer containing at least said photo-absorption layer has a mesa structure,
wherein a side wall of said mesa is provided with a protective film covering said side wall,
wherein said protective film is a silicon nitride film containing hydrogen, and
wherein a hydrogen concentration in one surface of said protective film located at the side of said mesa side wall is lower than a hydrogen concentration in the other surface of said protective film located at the side that is opposite to the side of said mesa side wall.

2. The semiconductor light receiving element as set forth in claim 1, wherein said protective film includes a plurality of stacked silicon nitride films containing hydrogen, and wherein a hydrogen concentration of one of said silicon nitride films that is located most closely to said mesa side wall is lower than a hydrogen concentration of one of said silicon nitride films that is located at the top layer of said protective film.

3. The semiconductor light receiving element as set forth in claim 2, wherein said protective film includes three or more of the stacked silicon nitride films containing hydrogen.

4. The semiconductor light receiving element as set forth in claim 1, wherein the hydrogen concentration in said protective film is distributed so as to continually increase or stepwise increase in two or more steps, from said one surface of said protective film located at the side of said mesa side wall toward said other surface of said protective film located at the side that is opposite to the side of said mesa side wall.

5. The semiconductor light receiving element as set forth in claim 1, wherein a first region and a second region are formed in said protective film, said first region including said one surface of said protective film located at the side of said mesa side wall and having a hydrogen concentration per unit volume of equal to or higher than $5\times10^{21}$ (atoms/cm$^3$) and equal to or lower than $1\times10^{22}$ (atoms/cm$^3$), and said second region including said other surface of said protective film located at the side that is opposite to the side of said mesa side wall and having a hydrogen concentration per unit volume of equal to or higher than 2 folds of, and equal to or lower than 10 folds of, the hydrogen concentration per unit volume of said first region.

6. The semiconductor light receiving element as set forth in claim 1, wherein said mesa is composed of said semiconductor layer including said photo-absorption layer, an avalanche multiplication layer and a field buffer layer, and
wherein said semiconductor light receiving element is an avalanche photodiode.

7. The semiconductor light receiving element as set forth in claim 1, wherein a thickness of said protective film is equal to or smaller than 0.8 µm.

8. The semiconductor light receiving element as set forth in claim 1, wherein
said semiconductor layer is configured to contain group III-V compound semiconductor.

* * * * *